United States Patent [19]

Zinn

[11] Patent Number: 5,021,923

[45] Date of Patent: Jun. 4, 1991

[54] CENTRAL CURRENT DISTRIBUTION ARRANGEMENT, ESPECIALLY FOR MOTOR VEHICLES

[75] Inventor: Bernd Zinn, Ennepetal, Fed. Rep. of Germany

[73] Assignee: Grote & Hartmann GmbH & Co. KG, Wuppertal, Fed. Rep. of Germany

[21] Appl. No.: 430,680

[22] Filed: Nov. 2, 1989

[30] Foreign Application Priority Data

Nov. 9, 1988 [DE] Fed. Rep. of Germany ... 8814031[U]

[51] Int. Cl.[5] .......................... H02B 1/00; H02B 1/12; H05K 5/06; H01R 13/52

[52] U.S. Cl. .................................... 361/380; 361/399; 361/395; 439/272; 439/724

[58] Field of Search ................. 439/76, 272, 271, 723, 439/724; 174/52.1, 65 R, 59; 200/303; 361/331, 334, 380, 395, 399

[56] References Cited

U.S. PATENT DOCUMENTS

| | | | |
|---|---|---|---|
| 3,904,812 | 9/1975 | Daffron | 439/271 |
| 4,826,452 | 5/1989 | Sian et al. | 439/271 |
| 4,874,325 | 10/1989 | Bensing et al. | 439/272 |

FOREIGN PATENT DOCUMENTS

| | | | |
|---|---|---|---|
| 130844 | 1/1985 | European Pat. Off. . | |
| 689429 | 3/1940 | Fed. Rep. of Germany . | |
| 2238620 | 2/1974 | Fed. Rep. of Germany . | |
| 2364794 | 8/1974 | Fed. Rep. of Germany . | |
| 2942569 | 4/1980 | Fed. Rep. of Germany . | |
| 3310477 | 1/1984 | Fed. Rep. of Germany . | |
| 3441559 | 5/1986 | Fed. Rep. of Germany . | |
| 3525863 | 1/1987 | Fed. Rep. of Germany . | |
| 8708170 | 2/1988 | Fed. Rep. of Germany . | |
| 2115614 | 9/1983 | United Kingdom | 361/331 |

*Primary Examiner*—Leo P. Picard
*Assistant Examiner*—Michael W. Phillips
*Attorney, Agent, or Firm*—Goodman & Teitelbaum

[57] ABSTRACT

A central current distribution arrangement, especially for motor vehicles, for the connection of electric feed lines with electric components of a carrier plate arranged in a casing. Openings are provided in at least one casing longitudinal wall or in at least one casing transverse wall for the passage of electric connecting elements. The openings extend through outward projecting first coupling arrangements, which are preferably molded onto the casing in one piece. Second coupling arrangements are provided with electric contact elements which are connected to electric lines. The method coupling arrangements are coupled to the first coupling arrangements. At least one sealing ring is disposed between a first and a second coupling element, and at least one sealing ring is disposed between an electric line and one associated second coupling arrangement to assure a moisture-proof and watertight arrangement of each first and second coupling arrangement. The casing includes a cover and a casing trough with a sealing ring being disposed between the cover and the casing trough.

19 Claims, 4 Drawing Sheets

CENTRAL CURRENT DISTRIBUTION ARRANGEMENT, ESPECIALLY FOR MOTOR VEHICLES

The present invention relates to a central current distribution arrangement, especially for motor vehicles.

The dependable functioning of the electrical installation has a substantial influence on the operating safety of motor vehicles. This is especially true when, as is increasingly usual today, important functions of the drive and safety arrangements are electronically controlled or regulated.

Electric components used in motor vehicles, such as the current distributor here under discussion, must, therefore, be formed in such a way that they fulfill their function dependably for years under extreme environmental conditions, for example under very different temperatures. A special problem for current distributors arises through moisture, caused, for example by spray water or sweat which can impair the functioning of the current distributor or completely prevent it from functioning.

The desired trouble-free functioning, however, can be realized only if, simultaneously, account is taken of the requirements of modern large series production in respect to the economical production of the individual components and the simple and dependable assembling thereof.

With German patent 33 34 097 there has become known a current distributor for the wiring of motor vehicles which is supposed to make possible a simple and secure final assembling. This current distributor has a carrier plate consisting of individual parts that can be put together in the manner of a puzzle. The cables are led into the casing through openings in the side walls. This has the disadvantage that water can force its way through these openings.

This known current distributor, therefore, is not only expensive to assemble, it is also inadequately protected against the penetration of moisture.

Underlying the present invention, therefore, is the problem of creating a distribution arrangement of the type mentioned at the outset, which is economical to produce and to assemble and which provides a secure protection against moisture.

This problem is solved according to the invention as set forth below, where preferable further developments of the invention are described.

Through the solution according to the invention there is created a very dependably functioning current distribution arrangement which is optimally protected against moisture and which is economical to produce and simple to assemble.

The use of coupling arrangements which are constructed in one piece with the casing prevents moisture from penetrating into the casing of the current distributor. The assembling is substantially simplified by the fact that the electric feed lines are received by second coupling arrangements or coupling plugs which only have to be placed on the first coupling arrangements in order to bring about the desired electrical connection.

The casing can be produced in a simple manner, for example by plastic injection molding.

By further developments of the invention, which are set forth below, the protection of the distributing arrangement is further improved, until finally, with use of seals between the casing joints, between the first and second coupling arrangements and between cable receptacles and cables, there is achieved an absolutely watertight formation of the current distributor. Simultaneously, however, the manufacturing expenditure and the assembling expenditure remain low.

The present invention is explained in detail by way of example with the aid of the drawing. Therein, partly in schematic representation:

FIG. 1*a* shows an exploded representation of a first example of execution of the current distribution arrangement according to the invention;

FIG. 1*b* shows a perspective view of the closed casing of FIG. 1*a;*

Figure 1A:
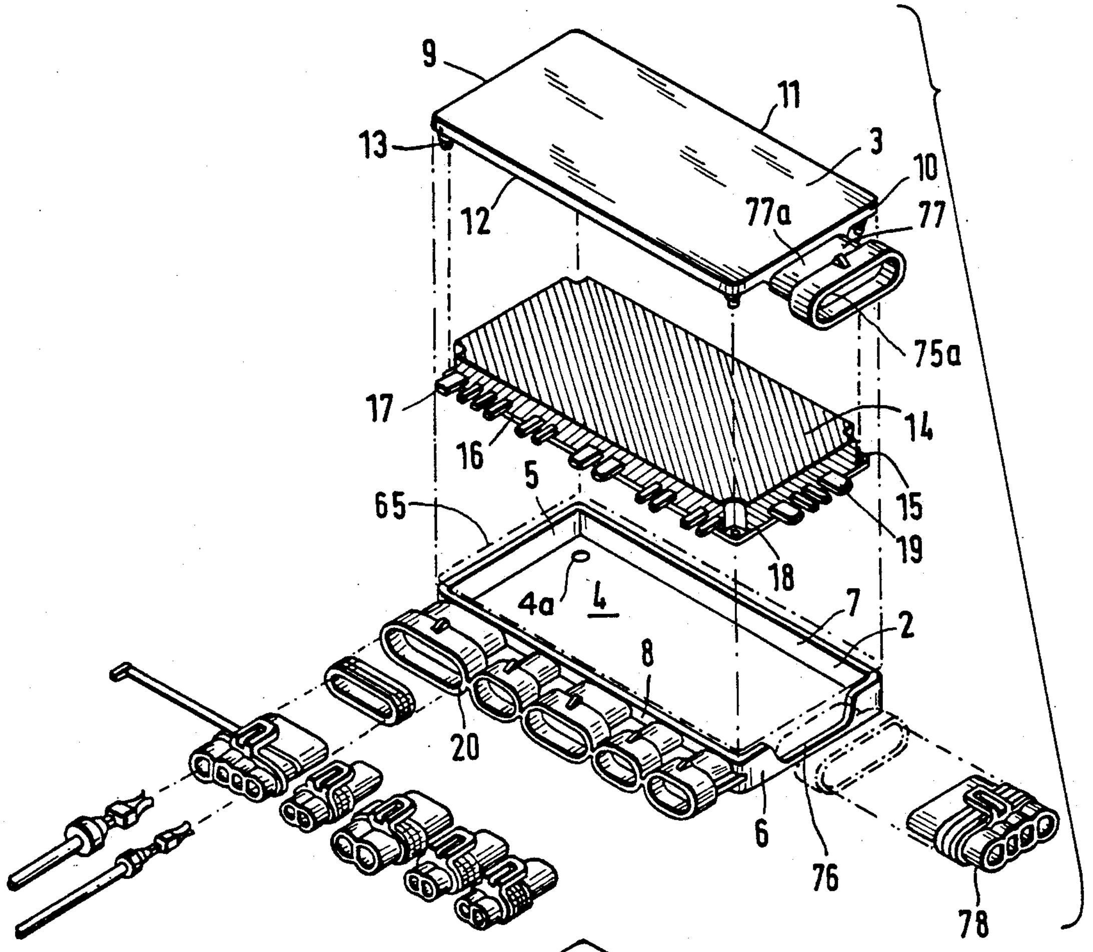
Figure 1B:
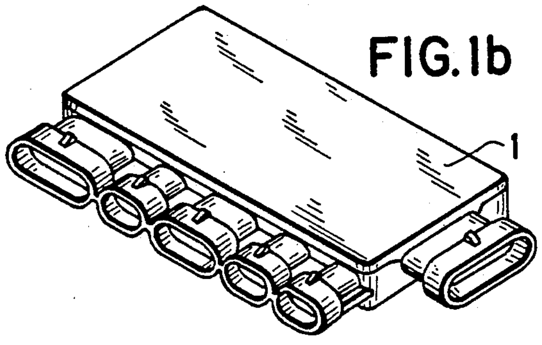

A first example of execution of the current distributing arrangement of the invention is described in reference to FIGS. 1*a*, 1*b*, 2 and 3. The current distribution arrangement has a casing 1 which is composed of a casing trough 2 and a cover 3. The casing trough 2 is constructed in slab form and consists of a bottom plate 4, a transverse left side wall 5, a transverse right side wall 6, a rear longitudinal wall 7 and a front longitudinal wall 8. The cover 3 is of plate form and has a transverse left side edge 9, a transverse right side edge 10, a rear longitudinal edge 11 and a front longitudinal edge 12.

On the upper edges of the longitudinal and transverse walls 7, 8 and 5, 6 there is arranged a surrounding, rectangular sealing ring 65, which provides for a watertight sealing between cover 3 and casing trough 2.

The casing trough 2 is provided at its corner portions with holes 4*a* opening upward. The cover 3 includes in its corner portions pins 13 correspondingly extending downward, which fit in these holes 4*a*. The tolerances of the pins 13 and of the holes 4*a* are such that the cover 3 is connectable in a removable manner with the casing trough 2 by the pressing of the pins into the holes.

In the casing of the distribution arrangement there is a carrier plate 14, constructed as a flat plate, which consists essentially of an electrically insulating material. The dimensions of this carrier plate are determined in such a way that the plate can be received, preferably without play, completely in the casing.

The carrier plate includes in the interior, conductor paths and can be provided in the interior, according to use in each case, for example, with plugging places for electrical components such as fuses, diodes, transistors, integrated circuits and the like. Such components are cast directly in the carrier plate and covered, for example, by plastic.

In order to position the carrier plate 14 exactly inside the casing, the carrier plate has in the four corner portions recesses 15 which in the assembling of the casing are penetrated by the pins 13 of the cover 3. On the front longitudinal edge 16 of the carrier plate 14, electric contact elements 17 project outward from the edge, which are arranged in groups and which are in the form of contact lugs with rectangular cross section. The contact elements 17 consist of an electrically conducting material and are adapted in their width to the current to be conducted in each case, i.e. they are made wider when a higher current is to be transmitted. The contact lugs are in electrical conducting connection with the electric components cast in the carrier plate.

On the transverse right side edge 18 of the carrier plate 14 there are arranged further contact lugs 19, likewise arranged in groups, which likewise project outward from this edge and are likewise connected with electric components in the carrier plate.

Figure 2:
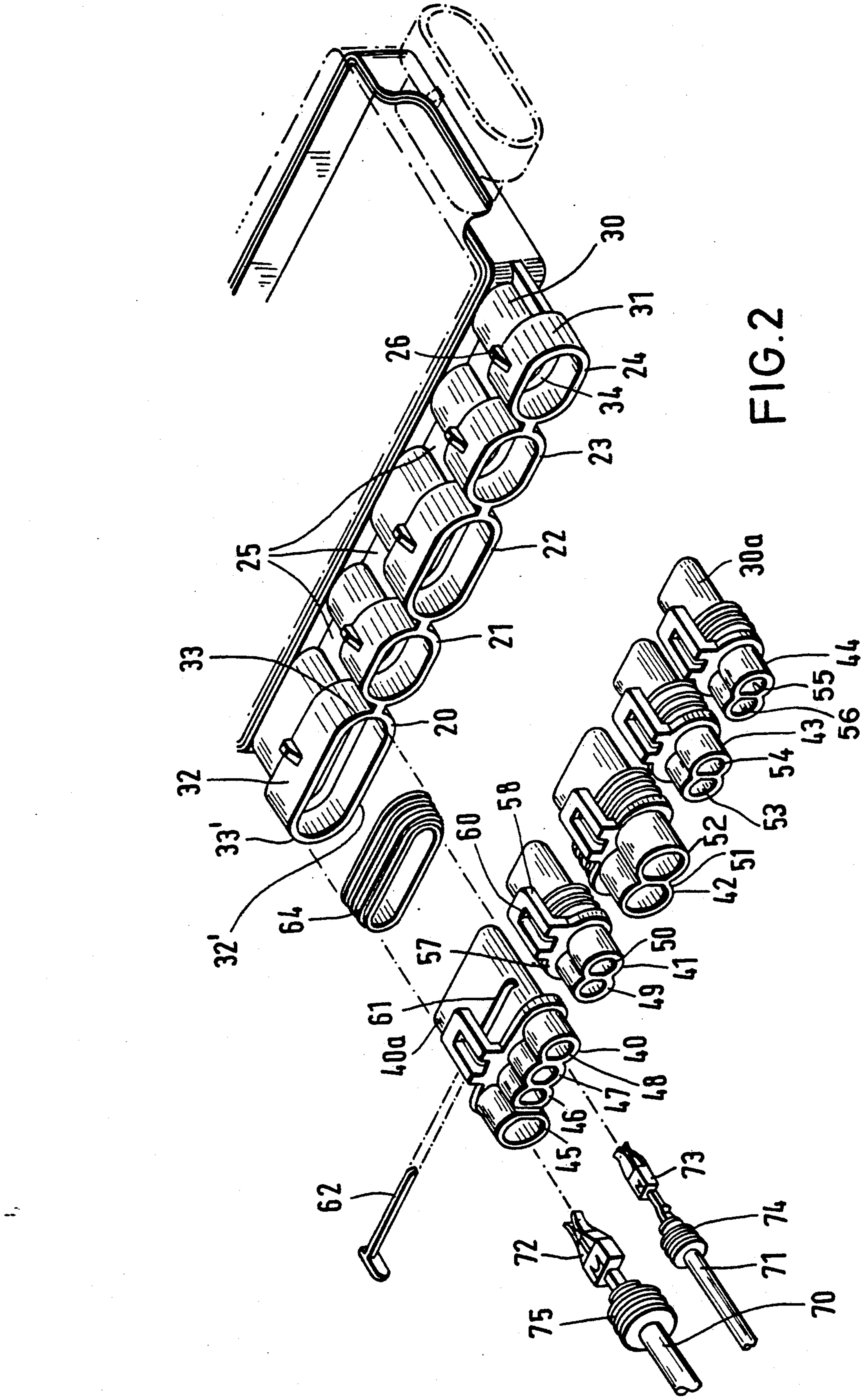
FIG. 2 shows an enlarged representation of a partial portion of FIG. 1.
Figure 3:
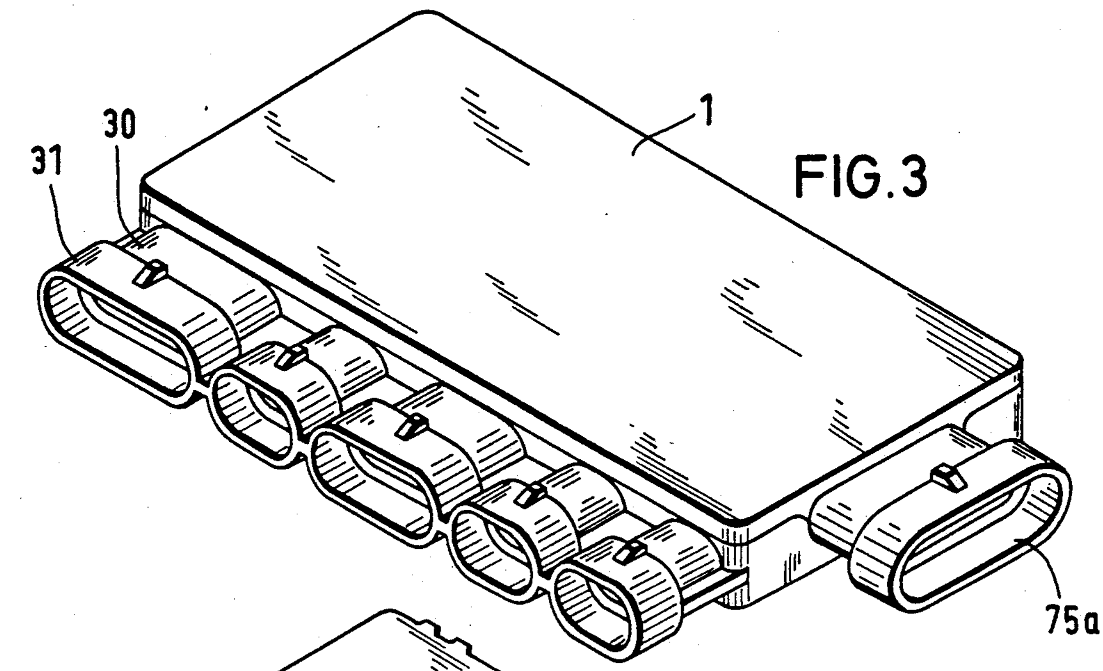
FIG. 3 shows an enlarged perspective view of the closed casing of the example of execution similar to FIG. 1*b;*

On the front longitudinal wall 8 of the casing trough 2 there are arranged, projecting outward, first coupling arrangements 20, 21, 22, 23, 24. The coupling arrangements are constructed as plug receptacles which are in each case the same height, but different widths. In FIG. 2, beginning from the left, there is arranged first of all a wide plug receptacle 20. Beside this plug receptacle there is a narrow plug receptacle 21 and next to it again a wide plug receptacle 22, which, however, is not as wide as the plug receptacle 20. Following upon the plug receptacle 22 there are provided two narrow plug receptacles 23 and 24, whose width corresponds to that of the plug receptacle 21.

The plug receptacles are made in one piece with the casing trough 2. In their interior the corresponding portion of the front longitudinal wall of the casing trough 2 includes in each case an opening (not visible in the figures), which makes possible the passage of the contact elements 17, so that they extend into the onset part 30 of the plug receptacles.

Between the individual plug receptacles there are provided material strips 25, which bring about a stiffening of the entire arrangement and thus improve the strength of the arrangement.

Each plug receptacle consists of a tubular onset part 30 and a collar 31 following upon it, constructed in one piece with the onset part. Between the tubular onset part and the collar there is formed on the inside an engagement step 34, the purpose of which will be explained below. The cross section of the individual plug receptacles is substantially oval, i.e. it consists of two flat strips 32, 32' arranged parallel to one another, which are joined with one another by two semicylindrical arcuate pieces 33, 33'. The spacing of the two flat strips, i.e., therefore, the height, is the same in all plug receptacles.

Each plug receptacle is provided on the surface of the flat strip 32 with a rest lug 26. Another rest lug, not visible in the figures, can be arranged correspondingly on the under-side.

The second coupling arrangements 40, 41, 42, 43, 44, hereinafter called plugs, are fitted in their dimensions to the plug receptacles and have, in their end portions facing the plug receptacle chambers, oval plug hollow bodies **30*a* including electrical connectors 72, 73, which hollow bodies are to be slid without play into the tubular onset part 30** of the plug receptacles. The plugs are injection molded in one piece from plastic.

The plug 40 which is provided for insertion into the plug receptacle 20 includes, in the part turned away from the plug receptacles, four tubular sealing chambers 45, 46, 47, 48 arranged parallel to one another, aligning with the chambers of the plug hollow body **30*a*, the outer end chambers 45, 48 being of greater diameter than the inner chambers 46, 47**.

The plug 41 which is intended for insertion into the plug receptacle 21 has two tubular chambers 49, 50 of identical diameter arranged parallel to one another. In like manner the plug 42 for the plug receptacle 22 has two tubular chambers 51 and 52, and the plug 43 for the plug receptacle 23 has the tubular chambers 53 and 54, and the plug 44 for the plug receptacle 24 has the corresponding tubular chambers 55 and 56.

Further, each plug is provided on the outside between the tubular chambers and the hollow body **30*a* with a holding ring 57 which embraces the plug, and which is constructed in one piece with a rest bow 58 extending in the direction of the hollow body 30*a*, which bow runs parallel to the tubular chambers. In the rest bow, there is provided a longitudinally running opening 60**.

In the upper wall **40*a* of the plug 40 there is provided a slit 61 running transversely to the longitudinal axis of the hollow body, which slit extends into the connector chambers, and into which a locking pusher 62 is slidable for the locking of the connectors 72, 73** slid into the chambers. According to the invention, for each plug there can be provided a locking slider or one locking slider for all the plugs.

Each plug has an oval lip ring seal 64 consisting of an elastic material, which embraces the oval section **30*a* of the plugs and is positioned in the collar 31 against the step 34. The ring seal 64 abuts against the holding ring 57, in which arrangement the bow 58** is disposed over the lip ring seal at a distance.

The tubular chambers of the plugs are adapted to receive cables 70, 71 with sealing rings 74, 75. These cables 70, 71 are provided on their free end with electrical connectors 72, 73 known in the state of the art. Each cable 70, 71 is equipped with a sealing ring 74, 75 known per se.

A further tubular plug receptacle **75*a*, constructed in the same manner as the plug receptacle 20, is centrally molded on the transverse right side edge 10 of the cover 3, and in such a way that the upper wall 77*a* is molded in one piece onto the transverse right side edge 10. The other portions of the plug receptacle 75*a* are constructed downward under the plane of the cover. In the transverse right side wall 6 of the casing trough 2, a corresponding recess 76 is provided, the dimension of which corresponds essentially to the dimensions of the tubular onset part 77 of the plug receptacle 75*a*, so that the lower portion of the onset part 77 can be positioned free of play in the recess 76, a sealing being provided to prevent penetration of moisture into the interior of the casing. Into this plug receptacle, a plug 78 is engaged which corresponds in its construction exactly to the plug 40**. This arrangement has the substantial advantage that a line feed is possible from two sides without the sealing against moisture being impaired.

The assembling and the functioning of the current distributing arrangement of the invention take place as follows:

In the assembling, first of all the carrier plate 14 is laid in the casing trough 2. This is accomplished by a swinging movement which makes it possible for the contact elements 17 to be placed into the corresponding openings of the front wall 8. Thereupon, the cover 3 is first slid on at the side on which the recess 76 is present and then placed down on the casing trough 2. There the plug receptacle **75*a* is sealed in the recess 76 of the casing trough 2. By first sliding the right side edge 10 on the casing trough 2 it is made possible for the contact elements 19 on the transverse right side wall 18** of the carrier plate 14 to be placed through the corresponding openings of the plug receptacle 75*a*.

In a further step then the connectors 72, 73 are thrust through the tubular chambers into the chambers of the hollow body 30*a* of the plugs and snapped in place or locked. The sealing rings 74, 75 are positioned in the tubular chambers. Further, the lip ring seals 64 are thrust onto the hollow body 30*a*. Thereupon, the plugs are inserted into the plug receptacles. In the process the contact spring arms of the connectors contact the appertaining contact elements 17, 19 of the carrier plate and thus bring about a secure electrical connection. When sliding into the plug receptacles, the bows 58 of the individual plugs snap in place with the corresponding rest lugs 26 of the plug receptacles. The lip ring seals 64 are pressed between the holding ring 57 and the step 34 of the plug receptacles and therewith bring about a watertight plug connection between plug and plug receptacle. The sealing rings 74, 75 seal off against penetration of moisture into the plugs.

Through molding of the plug receptacles onto the side wall of the casing trough or molding of at least one plug receptacle onto the transverse edge of the cover as well as the use of the lip ring seal 64 and use of the cable sealing rings 74, 75, and through the special construction and positioned of the carrier plate in the casing, and the simple annular seal between casing trough and cover, there is achieved, therefore, a completely moisture-proof and watertight closure of the current distribution arrangement.

In regard to the production of the casing it is to be pointed out that the casing trough with the plug receptacles arranged on it as well as the cover with at least one plug receptacle is injection molded from plastic in one manufacturing operation.

The plugs and the holding rings embracing them can likewise be injection molded in one piece from plastic.

The lip ring seals 64 and the cable sealing rings 74, 75 consist of a suitable soft material, such as, for example, rubber or the like.

Figure 4:
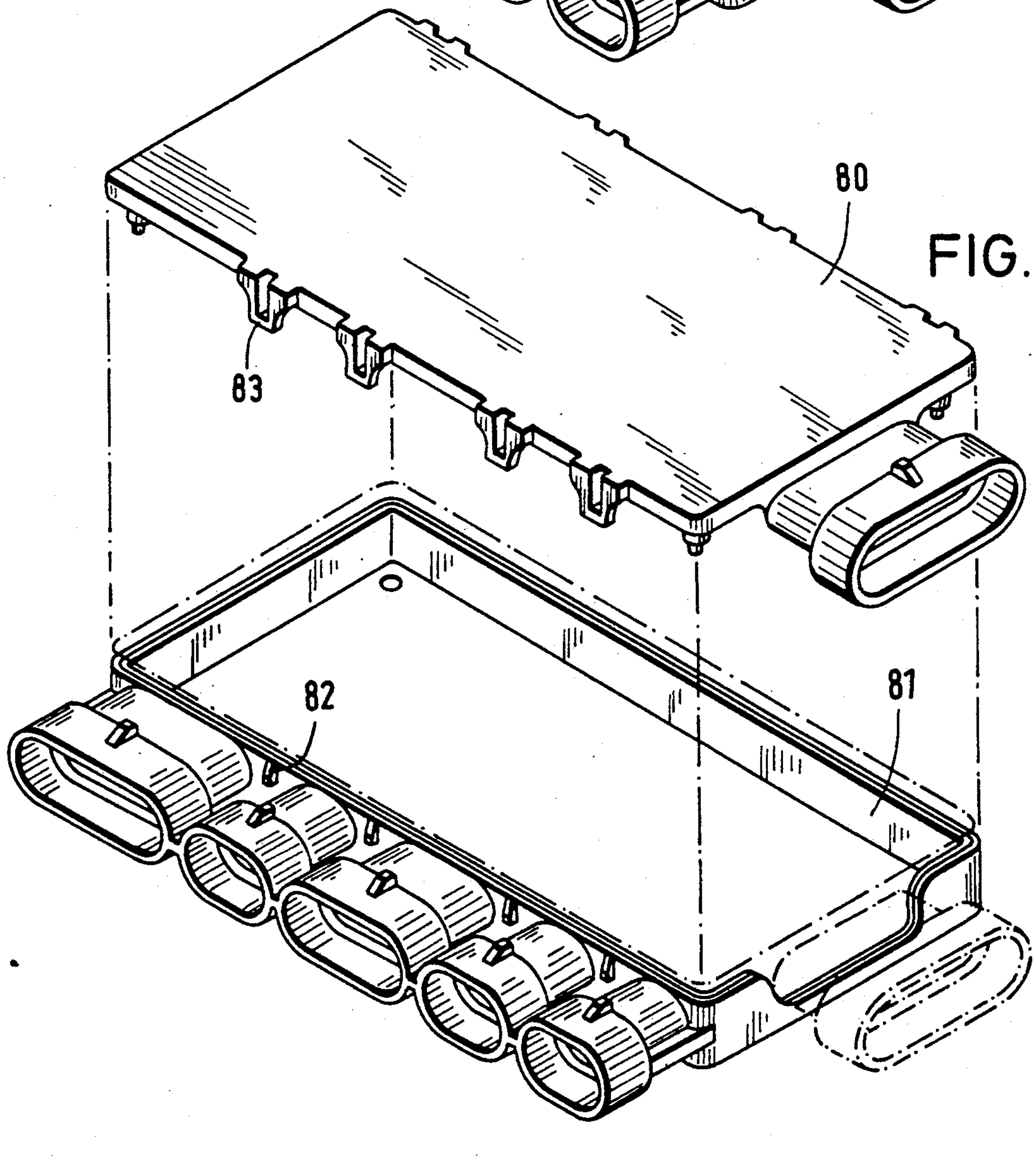
FIG. 4 shows an exploded representation of another example of execution of a casing for the distribution arrangement according to the invention.

A further example of execution of the current distributing arrangement is shown in FIG. 4. This example of execution corresponds substantially to that of FIGS. 1 to 3, but with the difference that here a further connection between the cover 80 and the casing trough 82 is brought about by rest lugs 81 on the casing trough and appertaining bows 83 on the cover.

Figure 5:
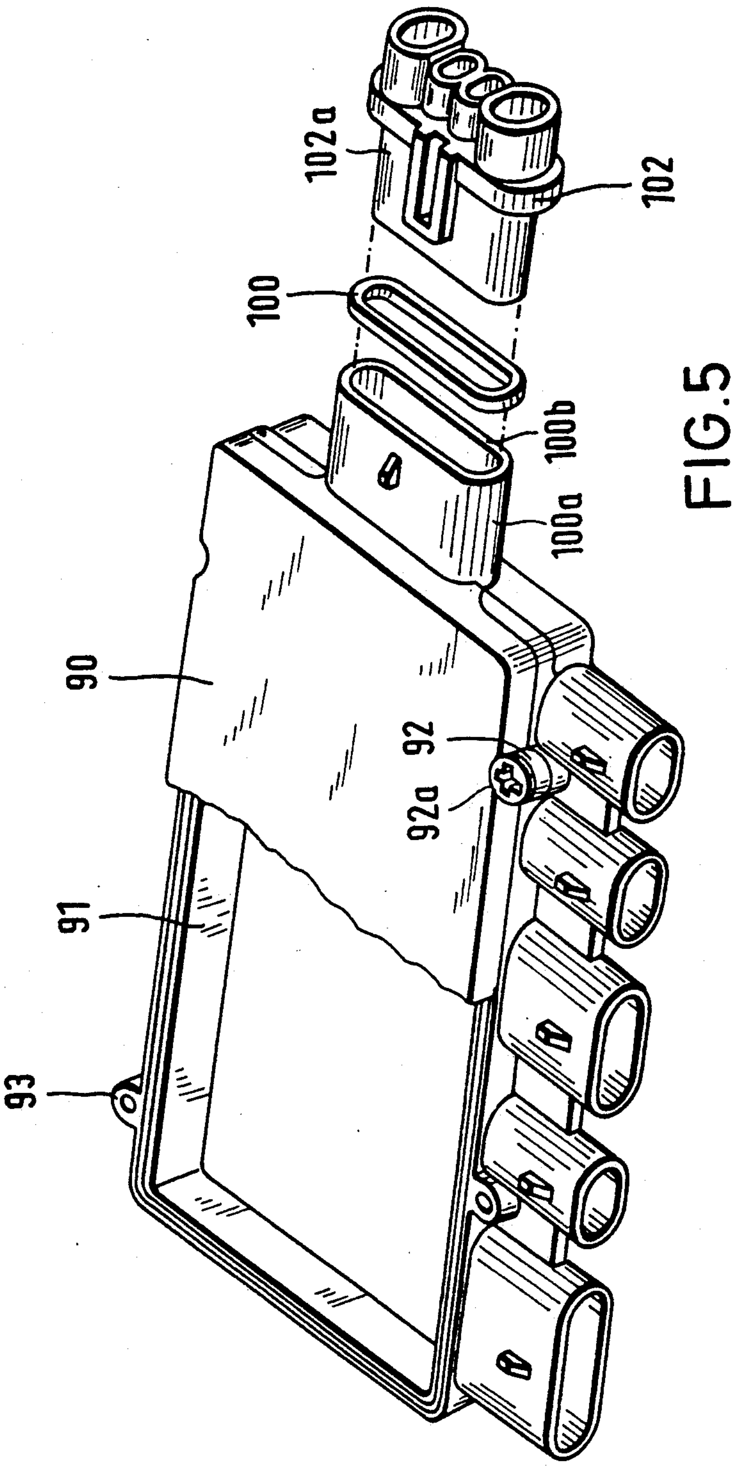
FIG. 5 shows a partially sectioned perspective view of another embodiment of a casing for the distributing arrangement of the invention, in which the carrier plate is omitted.

A further example of execution of the current distributing arrangement is shown in FIG. 5. In this example of execution the cover 90 is joined with the casing trough 91 by screws 92*a*, which engage in projections 93 on the casing trough 91 and projections 92 on the cover 90.

This example of execution has the advantage that the seal between cover and casing trough can be acted upon with a substantially predetermined pressure.

FIG. 5 shows, further, another development of the sealing of a plug with respect to a plug receptacle. In this embodiment the plug receptacle 100*a* has no collar. A sealing ring 100 abuts against the front edge 100*b* of the plug receptacle 100*a* and is supported against the front edge 102 of the plug 102*a*.

I claim:

1. A central current distribution arrangement, especially for motor vehicles, for connecting electric feed lines with electric components, said arrangement comprising:

a casing having a casing trough and a cover secured to said casing trough;

first coupling arrangements molded on a longitudinal front wall of said casing trough providing a one-piece construction with said casing trough;

openings extending through said first coupling arrangements into an interior of said casing trough;

said cover having a flat plate construction;

at least one third coupling arrangement molded to a transverse side edge of said cover providing a one-piece construction with said cover, a portion of said third coupling arrangement extending below a plane of said flat plate construction of said cover;

a recess provided in a transverse side wall of said casing trough, said portion of said third coupling arrangement positioned within said recess of said casing trough;

a hole extending through said third coupling arrangement into said interior of said casing trough;

a carrier plate positioned in said casing within said interior of said casing trough, said carrier plate fabricated from a plastic material and containing cast-in electric components;

contact lugs electrically connected to said electric components, said contact lugs projecting outward from a longitudinal front edge and outward from a transverse side edge of said carrier plate;

said contact lugs extending into said openings of said first coupling arrangements and into said hole of said third coupling arrangement;

second coupling arrangements provided with first electric contact elements connected to first electric feed lines;

first coupling means for coupling said first coupling arrangements to associated ones of said second coupling arrangements so that said first electric feed lines are connected with associated ones of said contact lugs projecting outward from said longitudinal front edge of said carrier plate;

a fourth coupling arrangement provided with second electric contact elements connected to second electric feed lines;

second coupling means for coupling said third coupling arrangement to said fourth coupling arrangement so that said second electric feed lines are connected with associated ones of said contact lugs projecting outward from said transverse side edge of said carrier plate;

first sealing ring means disposed between said first coupling arrangements and said associated ones of said second coupling arrangements providing a moisture-proof and watertight engagement therebetween;

second sealing ring means disposed between said third coupling arrangement and said fourth coupling arrangement providing a moisture-proof and watertight engagement therebetween;

third sealing ring means disposed between said first electric feed lines and associated ones of said second coupling arrangements providing a moisture-proof and water-tight connection therebetween;

fourth sealing ring means disposed between said second electric feed lines and said fourth coupling arrangement providing a moisture-proof and watertight connection therebetween; and fifth sealing ring means disposed between said cover and said casing trough providing a moisture-proof and watertight securement therebetween.

2. A central current distribution arrangement according to claim 1, wherein said contact lugs are contact pins.

3. A central current distribution arrangement according to claim 1, wherein said first and second coupling means include lug members on said first and third coupling arrangements and associated bow members on said second and fourth coupling arrangements, each of said bow members having an opening therein to slidingly receive an associated one of said lug members to secure said first coupling arrangements to said second coupling arrangements and to secure said third coupling arrangement to said fourth coupling arrangement.

4. A central current distribution arrangement according to claim 1, wherein said cover includes pins, and said casing trough includes holes for receiving associated ones of said pins in a force-fit arrangement to secure said cover to said casing trough.

5. A central current distribution arrangement according to claim 1, wherein said casing trough includes lug members, and said cover includes associated bow members, each of said bow members having an opening therein to slidingly receive an associated one of said lug members to secure said cover to said casing trough.

6. A central current distribution arrangement according to claim 1, including screw means for securing said cover to said casing trough.

7. A central current distribution arrangement according to claim 1, wherein a slit is provided in a bow on each of said second coupling arrangements, and rest lug being slidable into each said slit to pass through each said bow for locking said first electric contact elements within said second coupling arrangements.

8. A central current distribution arrangement according to claim 1, wherein a portion of said fourth coupling arrangement is received in said hole of said third coupling arrangement, said fourth coupling arrangement being provided with a supporting ring, said second sealing ring means being abuttingly engaged between said supporting ring and a free edge of said third coupling arrangement disposed around said hole.

9. A central current distribution arrangement according to claim 1, wherein said first coupling arrangements are plug receptacles, and said second coupling arrangements are plugs.

10. A central current distribution arrangement according to claim 9, wherein each of said plug receptacles has an oval configuration.

11. A central current distribution arrangement according to claim 9, wherein said plugs are fabricated from a plastic material, each of said plugs having a one piece construction.

12. A central current distribution arrangement according to claim 9, wherein each of said plug receptacles includes a tubular onset part molded to said longitudinal front wall of said casing trough.

13. A central current distribution arrangement according to claim 12, wherein a collar is molded onto a free end of said onset part of each of said plug receptacles, an engagement step being provided inside each of said plug receptacles between said onset part and said collar.

14. A central current distribution arrangement according to claim 13, wherein a plug portion on one end of each of said plugs is insertable through said collar and being slidable without play into said onset part of an associated one of said plug receptacles, said plug portion being a plug hollow body having chambers therein receiving associated ones of said first electric contact elements.

15. A central current distribution arrangement according to claim 14, wherein a transversely extending slit is provided in a wall of said plug hollow body, said slit extending into said chambers of said plug hollow body, a locking slide piece being slid into said slit and said chambers to lock said associated ones of said first electric contact elements within said chambers, said first electric contact elements being electric connectors.

16. A central current distribution arrangement according to claim 14, wherein an opposite end of each of said plugs is provided with tubular seal chambers in alignment with associated ones of said chambers of said plug hollow body thereof.

17. A central current distribution arrangement according to claim 16, wherein one of said first electric feed lines and one of said third sealing ring means are seated in each of said tubular seal chambers, each one of said first electric contact elements being connected to an associated one of said first electric feed lines and being secured in one of said chambers of said plug hollow body associated therewith, said first electric contact elements being electric connectors.

18. A central current distribution arrangement according to claim 16, wherein a holding ring is provided on each of said plugs and extends transversely between said tubular seal chambers and said plug hollow body of each of said plugs.

19. A central current distribution arrangement according to claim 18, wherein said first sealing ring means includes a sealing ring fabricated from an elastic material and disposed on said plug hollow body of each of said plugs, each said sealing ring being disposed within said collar of associated ones of said plug receptacles in an abutment arrangement between said engagement step and said holding ring associated therewith.

* * * * *